US008158011B2

(12) United States Patent
Zhang et al.

(10) Patent No.: US 8,158,011 B2
(45) Date of Patent: Apr. 17, 2012

(54) METHOD OF FABRICATION OF CUBIC BORON NITRIDE CONICAL MICROSTRUCTURES

(75) Inventors: Wen-Jun Zhang, Hong Kong (CN); Igor Bello, Hong Kong (CN); Shuit-Tong Lee, Hong Kong (CN); You-Sheng Zou, Hong Kong (CN); Yat Ming Chong, Hong Kong (CN); Qing Ye, Hong Kong (CN)

(73) Assignee: City University of Hong Kong, Kowloon (HK)

( * ) Notice: Subject to any disclaimer, the term of this patent is extended or adjusted under 35 U.S.C. 154(b) by 579 days.

(21) Appl. No.: 12/250,716

(22) Filed: Oct. 14, 2008

(65) Prior Publication Data
US 2010/0093171 A1 Apr. 15, 2010

(51) Int. Cl.
*C25F 3/00* (2006.01)
*B44C 1/22* (2006.01)
(52) U.S. Cl. .... 216/11; 438/689; 438/694; 257/E21.214
(58) Field of Classification Search .................. 438/689, 438/694; 216/11; 257/E21.214
See application file for complete search history.

(56) References Cited

U.S. PATENT DOCUMENTS
2008/0044647 A1* 2/2008 Nishibayashi et al. ....... 428/332

FOREIGN PATENT DOCUMENTS
JP 06236859 A * 8/1994

OTHER PUBLICATIONS

X. Jiang et al., *Heteroepitaxial diamond growth on (100) silicon*, Diamond and Related Materials, 2 (1993) 1112-1113.
Kian Ping Loh et al., *Negative electron affinity of cubic boron nitride*, Diamond and Related Materials 8 (1999) 781-784.
P. B. Mirkarimi et al., *Review of advances in cubic boron nitride film synthesis*, Materials Science and Engineering, R21 (1997) 47-100.
Osamu Mishima et al., *High-Temperature Cubic Boron Nitride P-N Junction Diode Made at High Pressure*, Science, vol. 238, Oct. 9, 1987, Reports, 181-183.

(Continued)

*Primary Examiner* — Nadine Norton
*Assistant Examiner* — Mahmoud Dahimene
(74) *Attorney, Agent, or Firm* — Leydig, Voit & Mayer, Ltd.

(57) ABSTRACT

A conical structure of cubic Boron Nitride (cBN) is formed on a diamond layered substrate. A method of forming the cBN structure includes steps of (a) forming diamond nuclei on a substrate, (b) growing a layer of diamond film on the substrate, (c) depositing a cBN film on said diamond layer, (d) pre-depositing nanoscale etching masks on the cBN film, and (e) etching the deposited cBN film. In particular, though not exclusively, the cubic Boron Nitride structure has great potential applications in probe analytical and testing techniques including scanning probe microscopy (SPM) and nanoindentation, nanomechanics and nanomachining in progressing microelectromechanical system (MEMS) and nanoelectyromechanical system (NEMS) devices, field electron emission, vacuum microelectronic devices, sensors and different electrode systems including those used in electrochemistry.

12 Claims, 4 Drawing Sheets

OTHER PUBLICATIONS

N. V. Novikov, *New trends in high-pressure synthesis of diamond*, Diamond and Related Materials 8 (1999) 1427-1432.

Toyonobu Yoshida et al., *Vapour phase deposition of cubic boron nitride*, Diamond and Related Materials 5 (1996) 501-507.

Wenjun Zhang et al., *Epitaxy on Diamond by Chemical Vapor Deposition: A Route to High-Quality Cubic Boron Nitride for Electronic Applications*, Adv. Mater. 2004, 16, No. 16, Aug. 18, 1405-1408.

W. J. Zhang et al., *Structuring single-and nano-crystalline diamond cones*, Diamond and Related Materials 13 (2004) 1037-1043.

W. J. Zhang et al., *Thick and adherent cubic boron nitride films grown on diamond interlayers by fluorine-assisted chemical vapor deposition*, Applied Physics Letters, vol. 85, No. 8, Aug. 23, 2004, 1344-1346.

\* cited by examiner

METHOD OF FABRICATION OF CUBIC BORON NITRIDE CONICAL MICROSTRUCTURES

BACKGROUND OF THE INVENTION

1. Field of the Invention

The current invention relates to conical microstructures of cubic boron nitride and to arrays of such conical microstructures. The invention also relates to fabrication cubic boron nitride cone microstructures.

2. Background Information

Alike diamond, cubic boron nitride (cBN) is a material with extreme properties. It has the second highest hardness and second highest thermal conductivity next to diamond, wide band gap (~6.4 eV), high optical transparency up to the deep ultraviolet spectral region, extreme chemical inertness, and high dielectric strength. However boron nitride (BN) surpasses diamond in graphitization and oxidation temperatures and chemical inertness. cBN is inert to molten ferrous materials, but diamond is dissolved in these materials. The combination of these extreme mechanical, thermal and chemical properties makes cBN ideal material for cutting tools and tribological coatings involving steels and ferrous materials. Cubic BN is also a better material for production of high-power electronic devices operating at high temperature, high switching frequency and in harsh irradiative environment because of its wide band gap properties, expected high carrier mobilities and capacity of doping for either p-type or n-type conductivities [O. Mishima, J. Tanaka, S. Yamaoka, and O. Fukunaga, Science vol. 238, pps. 181-183, "High-temperature cubic boron nitride p-n junction diode made at high pressure", 1987].

Cubic BN powders synthesized by high-pressure high-temperature (HPHT) method have been commercially used in cutting tools and wear parts with metal cementing technique. However, the cBN powders usually have grain sizes ranging from submicron to millimeters [N. V. Novikov, Diamond Relat. Mater., vol. 8, pps. 1427-1432, "New trends in high-pressure synthesis of diamond", 1999], which constrains its application, especially in electronics. The practical application of cBN in film forms has also been hampered because the incompatibility of cBN with many types of substrates primarily in their physical properties and the process of synthesis, which leads to the poor cBN film properties including sensitivity to humidity, excessive stress, and delamination of film thicker than 200 nm. Recent novel approaches in synthesis, lowering the particle energy, introduction of fluorine chemistry, growth on diamond based substrates and use of gradient layers have provided thicker and well adherent films. Due to the compatibility in structural and physical properties of cBN and diamond, the introduction of diamond interlayer eases the cBN synthesis and even enables heteroepitaxial growth of cBN films. For example, using an electron cyclotron resonance (ECR) microwave plasma (MP) chemical vapor deposition (CVD) and a gas mixture of He—Ar—$N_2$—$BF_3$—$H_2$ allows us to deposit several μm thick cBN films over large areas on diamond substrates (~3 inches in diameter). (Zhang W J, Bello I, Lifshitz Y, Chan K M, Wu Y, Chan C Y, Meng X M, Lee S T, Appl. Phys. Lett., vol. 85, pps. 1344-1346, "Thick and adherent cubic boron nitride films grown on diamond interlayers by fluorine-assisted chemical vapor deposition", 2004). These cBN films grow directly and epitaxially on polycrystalline diamond substrates. The soft $sp^2$-BN incubation layer usually needed for cBN nucleation is absent. Thus the adhesion and crystal quality of the cBN films are much improved, which foresees exciting applications of cBN/diamond composite films (cBND) in protective, tribological and electronic applications.

Micro- and nano-conical structures have increasingly become of interest due to their special electronic and mechanical features. Diamond and silicon cones with high aspect ratios have been developed for the use in field emitting devices because of geometrical field emission enhancement and their time stability. Examples can be found in U.S. Pat. Nos. 6,762,543 and 5,627,427 and in the work of Zhang et al [Zhang W J, Wu Y, Chan C Y, Wong W K, Meng X M, Bello I, Lifshitz, Lee S T, Diam. Relat. Mater., vol. 13, pps. 1037-1043, "Structuring single- and nano-crystalline diamond cones", 2004]. Single crystalline diamond cones with small tip radius, high aspect ratio and defined crystal orientation as disclosed in U.S. Pat. No. 6,902,716 have the advantage in improving the resolution of AFM probes as well in other SPM.

Because of the superior properties surpassing diamond, cBN structures are exceptionally durable materials that could have even better electronic qualities than carbon counterparts. Due to the second highest hardness, elastic modulus, and thermal conductivity next to diamond, and doping capacity for both n- and p-type conductivity, a single cBN cone is also of great interest in many experimental methods of analysis and testing, for example, scanning probe microscopy (SPM), nanoindentation and other nanoprobe techniques. Furthermore, cBN cone with a large surface area benefits to improve the efficiency and sensitivity in the electrode and sensor applications. Thus, cBN cone could open new frontier in electroanalysis and stable sensor applications. Such cones can be used as a pressure sensor because of the stability of its crystal structure in extreme conditions. Cathodes are used in a number of electronic devices such as displays, power amplifiers and vacuum microelectronics. Conventional cathodes are relatively low current devices which require either high extraction voltages or elevated temperatures for operation. Accordingly, it would be desirable to provide a cold cathode which would function at lower temperatures and voltages than existing cathodes. Since cBN has negative electron affinity, there is a potential application of cBN in field emitting devices. However, availability of suitable cBN films and then their high switch-on electric field have hampered using them in these applications. The formation of high-density sharp cones of cBN would certainly decrease the switch-on electric field and promote its field emission applications.

Diamond pyramids are easily made by fabricating an array of pyramidal pits in a silicon substrate by anisotropic etching and filling the pits by CVD diamond and then removing the silicon substrate. However, Cubic BN nanostructures such as nanocones have not been possible hitherto because of the significant difficulties in preparing fundamental structures of cBN films with satisfactory quality and thickness over large areas.

SUMMARY OF THE INVENTION

According to the present invention there is provided a method of fabricating cBN conical structures and their arrays. The method comprises steps of:
 (1) forming diamond nuclei on a substrate,
 (2) growing a layer of diamond on said substrate,
 (3) depositing cBN film on said diamond layer,
 (4) pre-depositing nanoscale etching masks on the said cBN film, and
 (5) etching the said deposited cBN film.

The substrates may comprise diamond or non-diamond substrates including, but not limited to, semiconductors (e.g., silicon or silicon carbide), insulators (e.g., quartz and sapphire), metals (e.g., platinum and iridium) instead of films they may also include self-standing single crystal, polycrystalline and nanocrystalline diamond.

The diamond layer can be a single crystal diamond film/wafer, oriented polycrystalline diamond film grown with local heteroepitaxy, randomly-oriented polycrystalline diamond (poly-D), or nanocrystalline diamond (nano-D) films. The diamond films are prepared in a two-step process, i.e., nucleation and growth. The diamond nuclei are preferably formed either by bias-enhanced nucleation or by mechanical prescratching/seeding, and a continuous diamond film is deposited by CVD methods.

The adherent cBN films are deposited on diamond layer by either plasma enhanced chemical vapor deposition (PECVD) or physical vapor deposition (PVD) methods. Cubic BN films can be grown on diamond films directly in either a single or multi-step growth process using a wide range of particle energies from hundreds of eV down to energies close to the thermal particle energies. The diamond layer beneath the cBN film provides the structural compatibility, high adhesion, extreme supporting capacity for any mechanical applications and enables heteroepitaxial growth of cBN films. The absence of amorphous BN (aBN)/turbostratic BN (tBN) interface makes the cBND composite insensitive to humidity.

On top of the cBN film, nanoscale metal etching masks, in a form of thin films, are deposited using evaporation or sputtering methods, sized-selected colloidal metal particles and/or polymer-sphere lithography.

The etching of the cBN films is preferably carried out by applying a negative-bias in a hydrogen-based plasma. However, etching could also be carried out using any chemically reactive environment in synergy with either ion bombardment in plasma or ion beams applied to the cBN films. If it is desired the cBN cones can be made conductive by doping either during the formation of the cBN film, during the etching process, or post-growth/post-etching ion implantation. Doping may be carried out by introducing, for example, a silicon-containing, or sulfur-containing gas into the reactor. Mg or Be metal wires can be immersed into the plasma for cBN doping as well. Alternatively the doping can be conducted by ion implantation of group II (e.g., Be and Mg), group IV (e.g., C and Si), and Group VI (e.g., S) elements after cBN deposition or after etching process.

Further aspects of the invention will become apparent from the following description, which is given by way of example only.

BRIEF DESCRIPTION OF THE DRAWINGS

The embodiments of the invention will now be described by a way of examples and with reference to the enclosed evidence presented by figures and their descriptions, in which.

DETAILED DESCRIPTION OF THE PREFERRED EMBODIMENTS

Figure 1:
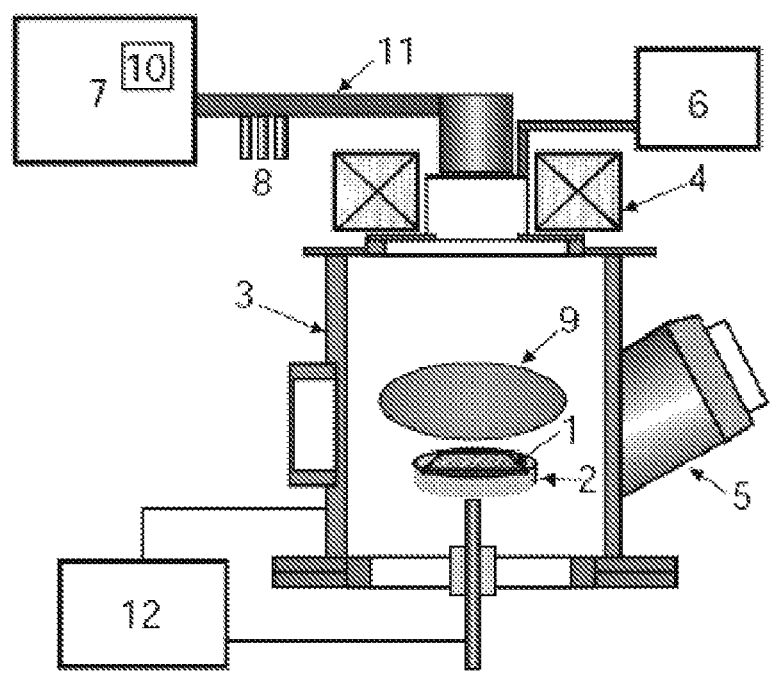
FIG. 1 is a schematic view of an apparatus for the use in carrying out a method according to an embodiment of this invention.

The invention will now be illustrated in a preferred form in which cBN cones and their arrays and formed by (1) nucleating diamond using either bias-enhanced nucleation or employing scratching on non-diamond substrates, (2) depositing a diamond film including randomly-oriented polycrystalline diamond, oriented diamond (may grow heteroepitaxially) or nanocrystalline diamond film on the substrate, (3) depositing a cBN film on the diamond layer by CVD or PVD methods, (4) coating the cBN film with a nano-scale etching mask, and (4) etching the cBN film with the mask in a chemically reactive environment in synergy with ion bombardment induced by applying a substrate bias. More details on this process and the resulting cBN cones and their arrays are described below. FIG. 1 shows the schematic diagram of a microwave plasma apparatus employed for fabricating diamond nanopillars in accordance with an embodiment of this invention. The apparatus includes sample 1, sample holder 2, reaction chamber 3, magnetic coil 4, turbomolecular pump 5, gas supply units 6, 2.45 GHz microwave generator 7, impedance transformer 8, plasma ball 9, powermeter 10, waveguide 11, and biasing power supply 12.

In preferred embodiments of this invention, a number of the parameters of the fabrication process, such as the choice of substrate, pretreatment, precoating, nucleation technique, the method of forming the diamond film, the method of forming the cBN film, the choice of etching mask, and the final etching process, can all be varied upon the particular nature of the desired cBN cones. In addition, the cBN cones can be made conducting by incorporating impurities such as Be, Mg, C, Si, and S, etc. either into the cBN film formation, into the etching environment, or by post-growth/post-etching ion implantation as discussed below.

The deposition of a diamond layer is preceded by diamond nucleation on a pretreated or/and precoated substrate which have the capacity to accommodate cBND composite with excellent adhesion. Firstly diamond is nucleated using either bias-enhanced nucleation as described by Jiang et al [Jiang et al., Diamond Relat. Mater., vol. 2, pps. 1112-1113, "Heteroepitaxial diamond growth on (100) silicon", 1993] on a non-diamond substrate or enhanced nucleation employing scratching a non-diamond substrate by hard powders of different composition and size such as diamond, SiC, $Al_2O_3$ or cBN. Secondly randomly oriented or highly oriented diamond films are grown in environment with low concentration of carbon gas precursor and via controlling other deposition parameters. Nanocrystalline diamond can however be prepared in environments of either inert gas/carbon gas precursor (e.g. $Ar/CH_4$) or hydrogen and carbon gas precursor with high concentration (e.g., $H_2/CH_4$ (10%)).

In embodiments of the present invention, the deposition of cBN/diamond composite structure can be prepared on a variety of non-diamond substrates including semiconductors (e.g., silicon or silicon carbide and nitride), insulators (e.g., quartz and sapphire), metals such (e.g., steels, molybdenum, tungsten, iridium and others), and alloys (e.g., tungsten carbide, titanium nitride, zirconium nitride, chromium nitride and carbide, and others), which can however be pretreated as described above. Alternatively, the pretreated substrates can be coated by a buffer layer, for example, with nitride or carbide layers or their combinations and gradient layers. The buffer layers can further be prescratched. All these pretreatments and precoatings can be combined prior to the deposition of cBND composite.

In the preparation of diamond films, CVD environments including either cold and thermal plasmas being excited by direct current, alternating current, radio-frequency, microwave or other electromagnetic radiations are possible. The flame and hot filament methods can be applied as well. Depending on the excitation method used, power can be supplied into the plasma via internal electrodes, capacitive and inductive coupling, antenna coupling, resonator coupling, surface-wave excitation or other known methods. As seen, in the case of diamond film deposition demonstrated as an example below, cold plasma was induced by microwaves, which were fed into a reactor via an impedance transformer.

The top cBN layer can be prepared by CVD methods using either cold (non-equilibrium) or thermal (equilibrium) plasma driven by direct, alternating current, high-frequency current, and microwaves or other electromagnetic radiations. Depending on the excitation method used, power can be supplied into the plasma via internal electrodes, capacitive and inductive coupling, antenna coupling, resonator coupling, surface-wave excitation or other known methods. As seen, in the case of cBN film deposition demonstrated as an example below, cold plasma was induced by microwaves in an electron cyclotron resonance (ECR) mode, which was fed into a reactor via an impedance transformer. The cBN structure is also controlled via the growth parameters, e.g., gas composition in the plasma, substrate temperature, bias voltage and other deposition parameters. The top cBN layer can also be prepared by a variety of ion assisted physical vapor deposition (PVD) methods including magnetron sputtering, ion assisted deposition, biased plasma deposition, ion beam deposition, and laser ablation as taught by Yoshida [T. Yoshida, Diamond Relat. Mat., vol. 5, pps. 501-507, "Vapor phase deposition of cubic boron nitride", 1996] and Mirkarimi et al [P. B. Mirkarimi, K. F. McCarty, and D. L. Medlin, Mater. Sci. Eng., vol. R21, pps. 47-100, "Review of advances in cubic boron nitride film synthesis", 1997]. The bombardment by energetic species (tens to hundreds of eV) coupled with the exposure to boron and nitrogen species (examples of the different exposure routes are: sputtering of a BN or boron carbide target, sputtering or evaporation of boron, boron containing gas, nitrogen or nitrogen containing gas) can be employed for the formation and the cBN phase growth.

In the embodiments of the present invention, the etching masks include the thin metal films, size-selected colloidal metal particles and polymer-sphere lithography. Furthermore, the etching masks can also be well patterned to form the desired cBN cone arrays. Different metals exhibiting selective resistance to etching environment can be employed in etching process. The mask metal (e.g., gold, silver, nickel, copper, iron and aluminum), selected for a particular etching environment, is deposited on the surface of cBN film by evaporation or sputtering methods. The metal film forms clusters during the etching process and acts as the masking medium for forming the cBN cones. The deposit of colloidal metal (e.g. gold and silver) particles on the cBN surface is another alternative etching mask. Taking advantage of the size selectivity of colloidal metal particles, it is possible to form etching masks of desired size with extremely narrow size distribution.

The reactive ion etching (RIE) environment is based predominantly on plasma-activated hydrogen. Inert gases such as argon or helium, oxygen, nitrogen and halogen-containing gas (fluorine or chlorine) can optionally be added to the gas phase in order to control the plasma, reaction rate, and phase purity of cBN cones. The optimum flow rates of these reactant gases considerably vary depending on the plasma type, method of plasma generation, gas pressure, and other processing parameters. The RIE can be carried out in various plasma systems and ion beams (including mass separated), ECR (Electron Cyclotron Resonance) etching, microwave plasma, inductively or capacitively coupled radiofrequency plasma and other plasmas. As an example below, the RIE is performed in a hydrogen-based microwave plasma to yield cBN cones.

The density, height and the diameter of cBN cones can be set to desired values by adjusting the conditions of RIE (e. g. etching gases, supplied power, etching pressure, negative bias, temperature and etching time) and the etching mask variety. The plasma etching to form the cBN cones is performed at a gas phase pressure of $10^{-4}$ to $10^2$ Torr, and the temperature ranging widely from room temperature to 1400° C. depending on the method of plasma generation. In the case of microwave mode operation described below, a suitable pressure is from 20 to 100 Torr. Plasma etching may however be performed not only in microwave plasma but also in DC plasma, arc jet plasma and others. Alternatively ion beams can be used as effective tools to etch cBN films to yield conical structure. In terms of the reaction etching rate, enhancement of the etching mask function and phase purity of the cBN cones prepared, the optimal temperature range is from 600 to 1000° C. The ion energy is another crucial parameter during the etching process for cBN cone formation. Therefore, the bias voltage including direct current or/and radio-frequency bias is employed, and the negative bias is preferably employed. The negative bias ranges from −100 V to −1000 V which is along with plasma potential responsible for the energy and momentum of incident ions. The ion energy varies upon many conditions such as the method of generating plasma, the gas composition, the gas pressure and the substrate materials.

Electrically conductive cBN cones may be produced by feeding a dopant-containing gas such as silicon-containing or sulfur-containing gas into the environment for the deposition of cBN films, or into the environment for etching of the cBN films or incorporating metals such as Be or Mg during the cBN deposition process. The optimum flow rate of such dopant-containing gas varies in accordance with electrical conductivity of cBN cones required, plasma type, method of plasma generation, gas pressure, and gas composition. The practical range of molecular concentration of dopant-containing gases in the plasma gas is from ppm level to tens of percent. Alternatively, the doping of the cBN films/cones can also be performed by ion implantation of group II (e.g., Be, Mg), group IV (e.g., C, Si), and group VI (e.g., S) elements after the film deposition or the formation of cBN cones. The ion energy (keV to MeV) and ion dose ($10^{13}$ to $10^{17}$/cm$^2$) are varied to control the electrical conductivity of cBN films/cones. Furthermore, an annealing can also be carried out at the temperature ranging from 200 to 1200° C. after the ion implantation to improve the conductivity of cBN films/cones.

The following example is presented for a further understanding of the cBN cones and their arryas, and the method of structuring cBN cones under present invention.

EXAMPLE

A polycrystalline diamond film was first deposited on silicon (001) substrate using the CVD apparatus shown in FIG. 1.

Prior to the diamond deposition, the substrate was scratched by diamond powder with a grain size of about 100 nm to enhance the diamond nucleation. During the deposition, plasma was induced in a 0.5% $CH_4$/99.5% $H_2$ mixture at a pressure of 30 Torr and total gas flow rate of 300 sccm. The deposition temperature was maintained at 850° C., and the microwave power was 1200 W.

The cBN film was subsequently deposited in the same apparatus, $BF_3$, $N_2$, He, Ar, and $H_2$ at gas flow rates of 1, 50, 140, 10 and 2 sccm, respectively, were supplied into the reaction chamber from a gas supply unit to secure the operation pressure of $2\times10^{-3}$ Torr. Using these conditions and a magnetic field of ~875 gauss applied to the central region of the reaction chamber employing an external magnetic coil, the deposition was carried out in an electron cyclotron resonance (ECR) mode. The microwave power was kept at 1400 W. In this particular case, direct current bias of −30 V, provided by a dc power supply, was applied to the substrate with respect to the grounded chamber. The cBN film was deposited at a substrate temperature of 950° C. for 4 hours in order to obtain a relative thick continuous film which is the starting material for structuring cBN cones. The completed cBND composite film is then coated with a thin gold layer by magnetron sputtering. During the RIE the thin gold film segregates to evenly distributed small colloidal particles that act as local masks in further RIE process.

Figure 2:
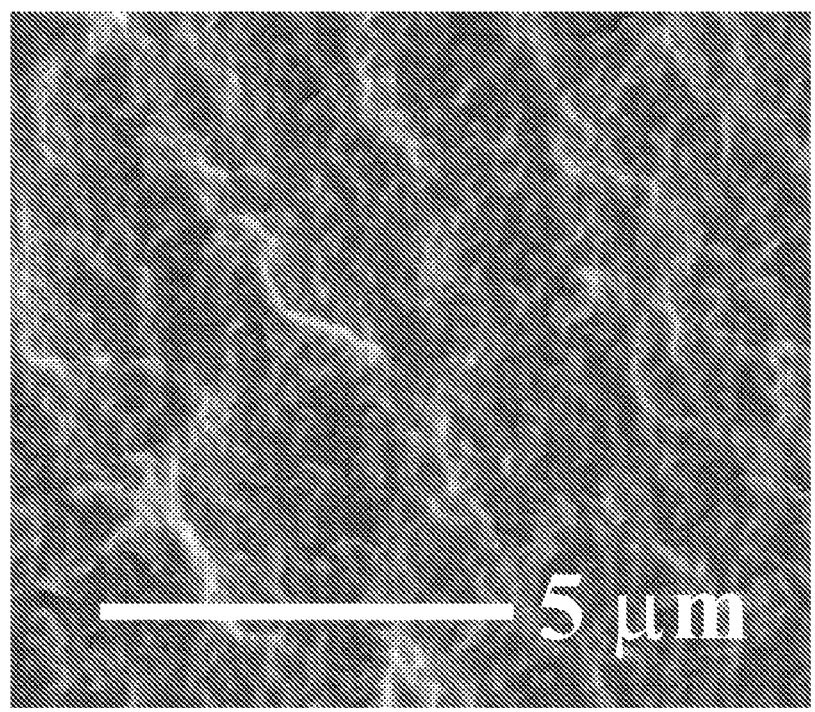
FIG. 2 is SEM plain-view image of the cBN/poly-diamond composite film in an intermediate stage of an embodiment of the present invention.
Figure 3:
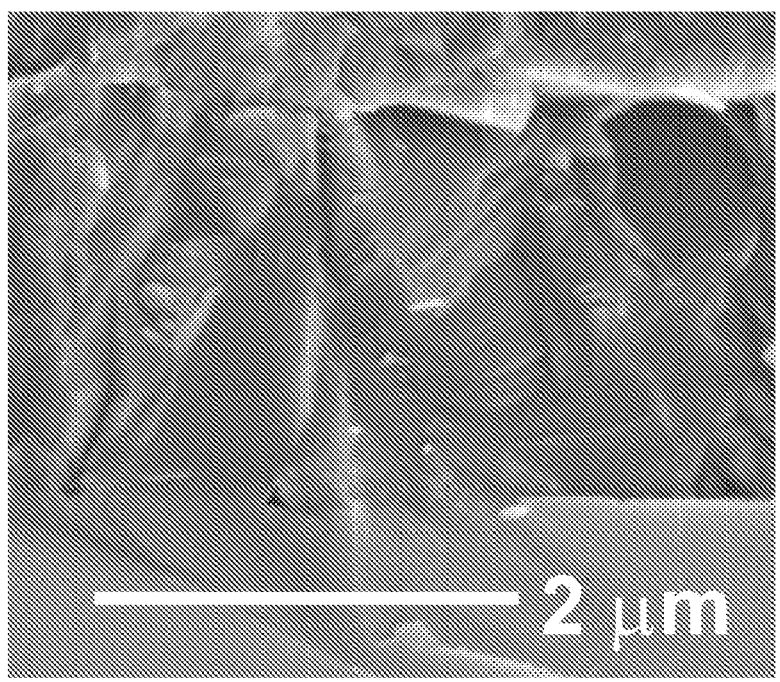
FIG. 3 is a SEM cross-sectional image of the cBN/poly-diamond composite film in an intermediate stage.

FIGS. 2 and 3 depict SEM plain-view and cross-sectional images of the cBN-diamond composite film deposited by this process, respectively. The surface morphology of cBN film in FIG. 2 shows a faceted structure with the grain sizes of several hundred nanometers, and the surface is a little rough in given magnification. The cross-sectional image, in FIG. 3, demonstrates the cBND composite layers to grow in columnar manner, elongated across the cBND cross-section from the substrate via diamond—cBN interface to the top of cBN. The thickness of cBN layer and diamond layer is about 1 micron and 2 micron, respectively. The interfacing cBN and diamond adhere well to each other. No interfacial voids and cracks are observed. The cBN film grows directly on poly-D film. Previous research by Zhang et al has shown that the aBN/tBN incubation layers are absent [Zhang et al., Adv. Mater., vol. 16, pps. 1405-1408, "Epitaxy on diamond by chemical vapor deposition: A route to high-quality cubic boron nitride for electronic applications", 2004].

The subsequent reactive ion etching (RIE) of the cBN film coated with a thin metal mask layer was carried out in the same deposition reactor. Prior to the etching of cBND films, the reactor chamber was evacuated to $10^{-6}$ Torr and then hydrogen at a flow rate of 200 sccm was supplied into the chamber from a gas supply unit to maintain operation pressure of 50 Torr. Microwave power of 1400 W supplied by a microwave generator was fed into the reactor to form a microwave hydrogen plasma. In this particular case, direct current bias of −360 V, provided by a dc power supply, was applied to the substrate with respect to the chamber at earth. The cBND film was afterward etched at a substrate temperature of 800° C.

Figure 4:
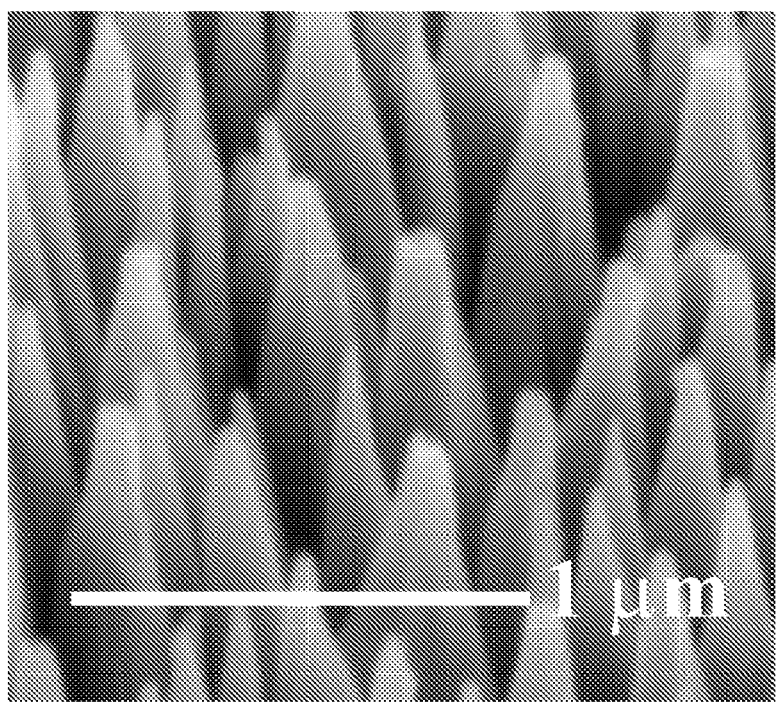
FIG. 4 is a SEM 45-degree image of an array cBN cones formed before complete removal of gold mask.
Figure 5:
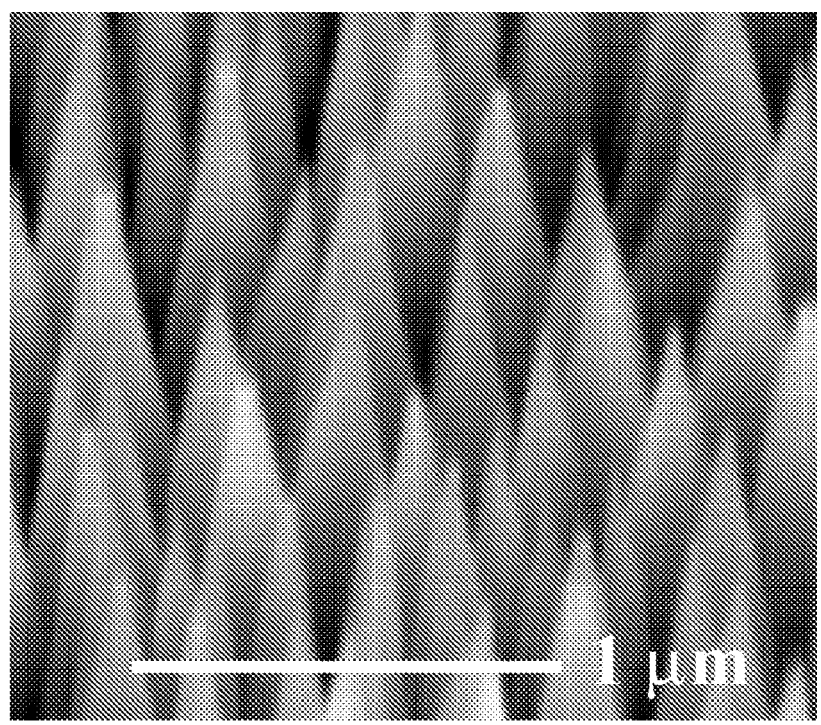
FIG. 5 is a SEM 45-degree image of the array cBN cones formed after complete removal of gold mask.

FIGS. 4 and 5 display SEM images of fabricated cBN cone arrays. At the initial etching stage, the gold layer segregates into uniformly distributed gold clusters (~100 nm in diameter) over the cBN surface. At high temperature and unceasing ion bombardment, the gold clusters then act as a nano-sized etching mask during the further RIE process. FIG. 4 shows the intermediate state of cBN nanocone-fabrication process corresponding to the incomplete sputtering of gold nanoclusters. Because of preferential etching of cBN over gold, there was a pillar-like section protected by the remaining gold mask. However in progressing etching, the gold nanoclusters reduce in size due to the sputter process, and consequently the pillars are sharpened. After etching for 45 minutes, the gold mask is completely removed, and eventually cBN cone arrays are formed with a high aspect ratio, in FIG. 5, due to the difference between the etching rate of the cone head and the cone root. FIG. 5 demonstrates that cBN cones are highly uniformed in both the tip size and aspect ratio, and the cone density is about $2\times10^9/cm^2$.

Figure 6:
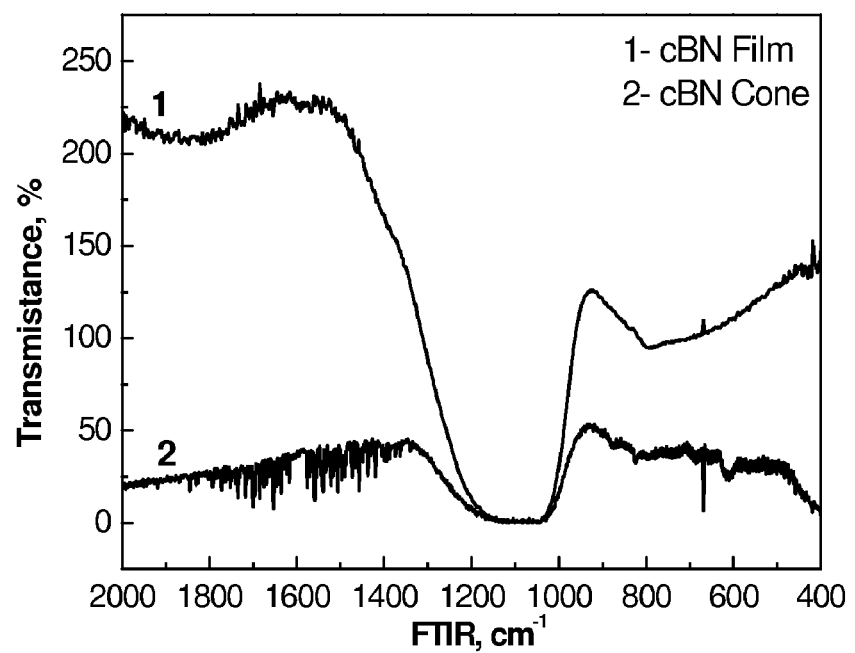
FIG. 6 illustrates the Fourier-transformed infrared spectra obtained from the cBN film in FIGS. 2 and 3, and cone arrays in FIGS. 3 and 4.

FIG. 6 represents two Fourier-transformed infrared absorption (FTIR) spectra collected from the cBND composites film (FIGS. 2 and 3) and the formed cBN cone arrays (FIGS. 3 and 4). The characteristic absorption of cBN is significant at about 1080 $cm^{-1}$, which corresponds to cBN T2 phonon mode Hexagonal BN peaks in the FTIR spectra of collected from the film and cone arrays are not evident, which indicates the content of cubic phase more than 99%.

Figure 7:
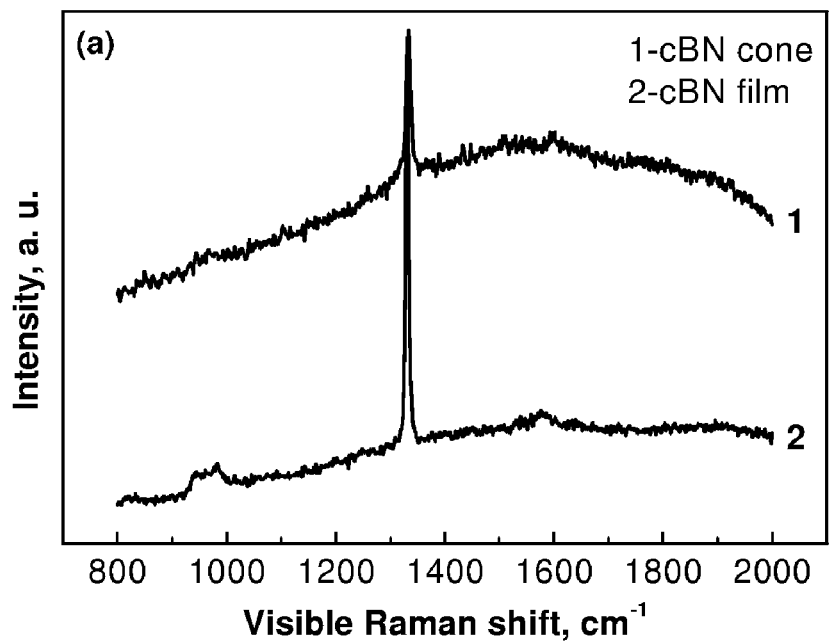
FIG. 7 illustrates the Visible Raman spectra obtained from the cBN film in FIGS. 2 and 3, and cone arrays in FIGS. 3 and 4.
Figure 8:
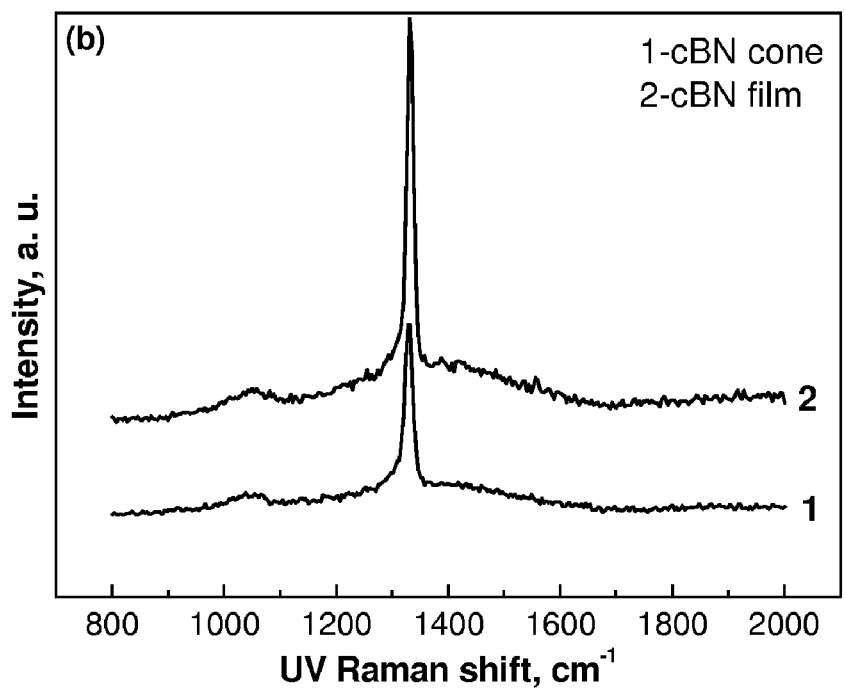
FIG. 8 illustrates the UV Raman spectra obtained from the cBN film in FIGS. 2 and 3, and cone arrays in FIGS. 3 and 4.

FIGS. 7 and 8 is a graph illustrating visible and UV Raman spectra collected from the cBND composite film and cBN cone arrays (corresponding to the samples shown in FIG. 2 to 5). In the visible Raman spectra using backscattering geometry and an argon ion laser with an excitation line at 514.5 nm (FIG. 7), there is only one characteristic diamond scattering mode present at 1331 $cm^{-1}$, indicating the existence of diamond intermediate layer in cBN cone array and cBND composite. Scattering peaks of cBN are not observed due to the small grains and defective nature of cBN. In the UV Raman spectra using argon ion laser with an excitation line at 244 nm (FIG. 8), besides the diamond peak, two more peaks located at about 1050 and 1304 $cm^{-1}$ are observed, which are assigned to the transverse optical (TO) and longitudinal optical (LO) phonon modes of cBN. Compared with the film, the diamond peak observed after cone formation upshifts by about 3 $cm^{-1}$, which is resulted from the stress generated by the high energetic ion bombardment during the etching process. According to the FTIR and Raman spectra of the cBN cone arrays, the cBN structure is not affected by plasma etching.

Since cBN has the second highest hardness and second highest thermal conductivity next to diamond, cBN cones fabricated by this invention can be used as measuring probes in high performance scanning probe microscopes (SPM) in particular atomic force microscopes (AFM), nanoindentors and scanning tunneling microscopes (STM) after doping. Further, the arrays of cBN cones with high density can also be used in field emitters and flat panel displays. Because of the extreme properties, the structured uniform cBN cones with a large surface area could be employed in electrode and sensor applications, and individual cones can be used for precession machining of microelectromechanical systems.

What is claimed is:

1. A method of fabricating a structure including conical cubic boron nitride microstructures, comprising:
  forming diamond nuclei on a substrate,
  growing a diamond film on the substrate,
  depositing a cubic boron nitride film on the diamond film,
  depositing a metal film on the cubic boron nitride film, and
  sequentially etching the metal film and the cubic boron nitride film, including etching the metal film in a hydrogen plasma, with a negative direct current bias applied on the substrate, so that the metal film segregates into distributed mutually separated nanoscale etching masks on the cubic boron nitride film, and
  etching the cubic boron nitride film into a plurality of conical microstructures, using the nanoscale etching masks to define the conical microstructures.

2. The method of claim 1, wherein the substrate is selected from the group consisting of silicon, silicon carbide, boron carbide semiconductors, boron nitride semiconductors, quartz, sapphire steel, molybdenum, tungsten, iridium, platinum, tungsten carbide, titanium nitride, zirconium nitride, chromium nitride, and chromium carbide.

3. The method of claim 1 including forming diamond nuclei by bias-enhanced nucleation.

4. The method of claim 1, wherein the diamond film is selected from the group consisting of a single-crystal diamond, an oriented diamond film with local heteroepitaxy, a randomly-oriented polycrystalline diamond film, and a nanocrystalline diamond film.

5. The method of claim 1 including depositing a diamond film by one of the deposition methods selected from the group consisting of thermal vapor deposition and plasma enhanced chemical vapor deposition.

6. The method of claim 1, wherein growing a diamond film comprises doping the diamond film.

7. The method of claim 6 including doping the diamond film by introducing a gas selected from the group consisting of a boron-containing gas, a sulfur-containing gas, and a phosphorous-containing gas while growing the diamond film.

8. The method of claim 1 including depositing the cubic boron nitride film by one of the deposition methods selected from the group consisting of ion assisted physical vapor deposition, plasma-enhanced chemical vapor deposition, and ion-assisted chemical vapor deposition.

9. The method of claim 1, wherein depositing a cubic boron nitride film comprises doping the cubic boron nitride film by introducing a dopant while depositing the cubic boron nitride film.

10. The method of claim 1 including depositing the metal film by one method selected from the group consisting of evaporation and sputtering.

11. The method of claim 1 including, while depositing the cubic boron nitride film, doping the cubic boron nitride film by introducing a gas selected from the group consisting of sulfur-containing gas and a silicon-containing gas.

12. The method of claim 1 including, before forming diamond nuclei, scratching the substrate to enhance nucleation of the diamond nuclei.

* * * * *